US010288998B2

(12) United States Patent
Fukui

(10) Patent No.: US 10,288,998 B2
(45) Date of Patent: May 14, 2019

(54) MASK BLANK WITH RESIST FILM AND METHOD FOR MANUFACTURING THE SAME AND METHOD FOR MANUFACTURING TRANSFER MASK

(71) Applicant: HOYA CORPORATION, Tokyo (JP)

(72) Inventor: Toru Fukui, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 36 days.

(21) Appl. No.: 15/327,191

(22) PCT Filed: Jul. 27, 2015

(86) PCT No.: PCT/JP2015/071194
§ 371 (c)(1),
(2) Date: Jan. 18, 2017

(87) PCT Pub. No.: WO2016/024473
PCT Pub. Date: Feb. 18, 2016

(65) Prior Publication Data
US 2017/0146901 A1 May 25, 2017

(30) Foreign Application Priority Data

Aug. 13, 2014 (JP) ................................ 2014-164854

(51) Int. Cl.
*G03F 1/50* (2012.01)
*G03F 7/004* (2006.01)
(Continued)

(52) U.S. Cl.
CPC .............. *G03F 1/50* (2013.01); *G03F 7/0045* (2013.01); *G03F 7/0046* (2013.01);
(Continued)

(58) Field of Classification Search
CPC ........................................................ G03F 1/50
See application file for complete search history.

(56) References Cited

U.S. PATENT DOCUMENTS 8,728,717 B2 * 5/2014 Kohl ..................... G03F 7/0045
430/320
2004/0013975 A1 1/2004 Kon et al.
(Continued)

FOREIGN PATENT DOCUMENTS

JP      H07-86119 A      3/1995
JP      H07-86127 A      3/1995
(Continued)

OTHER PUBLICATIONS

Oct. 20, 2015 International Search Report issued in International Patent Application No. PCT/JP2015/071194.

*Primary Examiner* — Kathleen Duda
(74) *Attorney, Agent, or Firm* — Oliff PLC

(57) ABSTRACT

A mask blank with resist film, includes a substrate having a thin film; and a negative resist film formed on a surface of the thin film, wherein in the resist film, a photoacid generator low-concentration region is formed at a part where the resist film is in contact with the thin film; a concentration of the photoacid generator low-concentration region is lower than that of the other region of the resist film; a thickness of the photoacid generator low-concentration region is 5% to 40% of the thickness of the resist film; and a concentration of the photo acid generator at a part in contact with the thin film in the photoacid generator low-concentration region is a value obtained by decreasing the concentration of the photo acid generator in the other region of the resist film by 10% to 40%.

7 Claims, 8 Drawing Sheets

(51) Int. Cl.
*G03F 7/038* (2006.01)
*G03F 7/16* (2006.01)

(52) U.S. Cl.
CPC .......... *G03F 7/0048* (2013.01); *G03F 7/0382* (2013.01); *G03F 7/16* (2013.01)

(56) References Cited

U.S. PATENT DOCUMENTS

| | | | |
|---|---|---|---|
| 2005/0277055 A1 | 12/2005 | Kon | |
| 2010/0273098 A1 | 10/2010 | Ogawa et al. | |
| 2012/0251930 A1 | 10/2012 | Kojima et al. | |
| 2013/0177841 A1 | 7/2013 | Sakai et al. | |
| 2015/0261896 A1* | 9/2015 | Smith | G03F 7/705 703/2 |

FOREIGN PATENT DOCUMENTS

| | | | |
|---|---|---|---|
| JP | 2004-045513 A | 2/2004 |
| JP | 2006-023699 A | 1/2006 |
| JP | 2006-287236 A | 10/2006 |
| JP | 2011-123426 A | 6/2011 |
| JP | 2013-164588 A | 8/2013 |
| JP | 2013-257593 A | 12/2013 |
| JP | 2014-106299 A | 6/2014 |
| WO | 2009/084516 A1 | 7/2009 |

* cited by examiner (a)

(b)

(a)

(b)

MASK BLANK WITH RESIST FILM AND METHOD FOR MANUFACTURING THE SAME AND METHOD FOR MANUFACTURING TRANSFER MASK

TECHNICAL FIELD

The present invention relates to a mask blank with resist film and a method for manufacturing the same and a method for manufacturing a transfer mask.

DESCRIPTION OF RELATED ART

A technique of forming a resist film using a negative chemically amplified resist and forming a resist pattern from the resist film is attracting attention because a fine pattern can be formed.

A mechanism of the negative chemically amplified resist is briefly described as follows. First, a photo acid generator (Photo Acid Generator: PAG) is contained in the resist solution. At the same time, a compound capable of causing photocrosslinking or photopolymerization reaction is contained therein. Exposure is performed after applying a resist solution, baking the same, and forming a film. Acid is generated due to a photoacid generator at a place where exposure is performed. The photocrosslinking and the photopolymerization reaction are advanced or promoted by this acid. In this manner, the exposed portion is hardened. Then, by developing the resist film, a non-exposed portion is removed, and only an exposed portion remains, so that a resist pattern is formed. Hereinafter, the negative type chemically amplified resist is abbreviated and is also called a "negative resist".

When a negative resist is used while forming a fine pattern, thinning or undercut occurs at a root of the pattern in some cases.

Various reasons can be considered, but one of the reasons is that when exposure is performed from the outermost surface of the resist film, the exposure light attenuates toward the bottom of the resist film and an exposure amount decreases. In such a case, sufficient exposure can not be performed in the vicinity of the thin film in contact with the resist film (the bottom portion of the resist film, hereinafter referred to as the "root of the pattern"). As a result, thinning or undercut occurs at the root of the pattern.

Another reason why the thinning or undercut occurs is a case where a thin film provided under the resist film adversely affects the formation of the resist pattern.

For example, paragraph [0008] of patent document 1 describes as follows. For example, when the resist film is formed on a chromium (Cr)-based thin film, the acid generated from the photoacid generator is inactivated due to the influence of Cr. As a result, the portion of the resist film in contact with the Cr-based thin film (hereinafter simply referred to as "Cr film") has less acid and consequently the degree of photopolymerization becomes smaller. In such a case, the thinning or undercut as described above is likely to occur in the resist pattern.

In order to solve the above problem, Patent Document 1 discloses that the thin film in contact with the resist film is treated so as not to contain chromium.

PRIOR ART DOCUMENT

Patent Document

Patent document 1: Japanese Patent Laid Open Publication No.2011-123426

SUMMARY OF THE INVENTION

Problem to be Solved by the Invention

Although it is possible to exclude the influence of Cr in the technique of Patent Document 1, in other words, restriction is imposed on the substance which can be used as the thin film provided under the resist film, and the degree of freedom in designing a mask blank is greatly lost.

An object of the present invention is to provide a technique capable of forming a good resist pattern while maintaining a high degree of freedom in designing the mask blank.

Means for Solving the Problem

As a simple technique for solving the abovementioned problem, it is sufficient to increase the concentration of the acid in the vicinity of the thin film in the resist film. However, no technique has been found to increase the concentration of acid in the region at a pinpoint. Therefore, in order to increase the concentration of the acid in the entire resist film, a technique of increasing the concentration of the photoacid generator that generates acid can be considered.

However, in the case of simply increasing the concentration of the photoacid generator in the entire resist film, the problem of reduction of resolution occurs in turn. When the concentration of the photoacid generator is high, acid is generated due to a scattered light such as forward scattering and backward scattering, thus involving a problem that the resist film is cured even though it is a non-exposed portion.

In addition, after examination by inventors of the present invention, it is found that thinning or undercut are sometimes occur or sometimes don't occur, depending on the kind of an element constituting the thin film. The inventors of the present invention consider it necessary to investigate the cause, to increase the degree of freedom of the element constituting the thin film of the mask blank.

As a result of intensive studies by the inventors of the present invention, it is found that in the case of the mask blank in which Cr is used as the thin film, the concentration of the photoacid generator in the vicinity of the Cr film in the resist film is reduced to about half. As described in Patent Document 1, it is conventionally known that an acid concentration is decreased due to Cr, but it is found by the inventors of the present invention that the concentration of the photo acid generator is about half in the vicinity of the Cr film. Moreover, this tendency largely differs depending on the elements constituting the thin film. For example, when Ta or $SiO_2$ is used in the thin film, there is almost no tendency as described above.

Based on this new knowledge, the inventors of the present invention carried out intensive studies regarding a technique of forming a good resist pattern using the negative resist, irrespective of the kind of element constituting the thin film. As a result, the inventors of the present invention reach an idea of completely reversing the past concept. In other words, the inventors of the present invention not only accept the abovementioned thinning or undercut which are considered to have an adverse influence on the formation of resist pattern, but also utilizes them contrarily.

Explanation will be given hereafter, using FIG. 1.

FIG. 1(A) is a schematic view illustrating a resist pattern when thinning or undercut occurs, wherein (A-1) is a cross-sectional view and (A-2) is a planar view.

FIG. 1(B) is a schematic view illustrating a case in which the root of the resist pattern becomes thicker than an outermost surface, and (B-1) is s cross-sectional view thereof and (B-2) is a planar view thereof.

Certainly, even if the development is performed after a desired shaped exposure is performed to the resist film, the balance of the protrusions of the resist pattern is lost when the thinning or undercut occurs in the resist pattern, and collapse of the resist pattern is caused thereby.

However, as illustrated in FIG. 1(A), when the development is performed after the desired shaped exposure is performed to the resist film, a resist pattern having a desired shape can be obtained when planarizing the resist pattern in which thinning or undercut occurs. Even if the thinning or undercut occurs, the resist pattern serves as a mask when etching is applied to the thin film under the resist pattern, and the shape of the main surface of the protrusion of the resist pattern is transferred to the thin film.

As illustrated in FIG. 1(B), if the root of the resist pattern is thicker than the outermost surface as opposed to the thinning or undercut, this means that the thin film is not etched into the shape of the outermost surface of the resist pattern which is supposed to most reflect an exposure shape. As a result, in view of transferring the resist pattern to the underlying thin film, the inventors of the present invention reach the idea that it is preferable to allow an appropriate thinning or undercut to occur in the resist pattern.

In other words, it is found by the inventors of the present invention, that the thinning or undercut in the resist pattern may be the cause of the adverse influence in the resist pattern, and on the other hand, it is possible to intentionally generate the thinning or undercut to the extent that the resist pattern does not collapse, which can help to obtain a good pattern shape.

In addition to the abovementioned knowledge, the present invention is provided in view of the reduction in the concentration of the photoacid generator that depends on the element constituting the thin film as described above. The configuration of the present invention is as follows.

<Configuration 1>

A first configuration of the present invention is a mask blank with resist film, including:

a substrate having a thin film; and a negative resist film formed on a main surface of the thin film, wherein in the resist film, a photoacid generator low-concentration region is formed at a part where the resist film is in contact with the thin film;

a thickness of the photoacid generator low-concentration region is 5% to 40% of the thickness of the resist film;

a concentration of the photo acid generator at a part in contact with the thin film in the photoacid generator low-concentration region is a value obtained by decreasing the concentration of the photo acid generator in the other region of the resist film by 10% to 40%; and in the photoacid generator low-concentration region , it is sufficient that the concentration of the photoacid generator in the region of the above thickness is lower than the region of other thickness and it is not matter whether or not the concentration of the acid generator is uniform over an entire region.

According to this configuration, by providing the photoacid generator low-concentration region at the part where the resist film is in contact with the thin film, thinning or undercut as illustrated in FIG. 1(A-1) is intentionally formed.

The resist pattern is adversely influenced simply by causing the thinning or undercut to occur without particular intension. Therefore, the "thickness" of the photoacid generator low-concentration region and the "concentration of the photo acid generator at the part where the resist film is in contact with the thin film" are set within the above ranges. By adopting this structure, it is possible to form the initially desired resist pattern satisfactorily in a planar manner without depending on the thin film.

It should be noted that the above structrue is achieved only by obtaining the knowledge of the present invention, namely, the knowledge such that "the photoacid generator in the vicinity of the thin film is reduced to half depending on the thin film" and "it is sufficient that the resist pattern has a desired shape in planar view" and "thinning or undercut is intentionally formed", and is not achieved if any one of the above knowledge is missing.

A second configuration of the present invention is a mask blank with resist film, wherein in the photoacid generator low-concentration region, the concentration of the photoacid generator is gradually decreased in a direction from the resist film to the thin film.

According to this configuration, similarly to the first configuration, the initially desired resist pattern can be satisfactorily formed in planar view. It is further preferable to gradually decrease the concentration of the photoacid generator in a thickness direction from the resist film 12 toward the thin film 11, in view of stabilizing the structure of the protrusions of the resist pattern. When the concentration of the photoacid generator is gradually decreased, it is possible to avoid the generation of the constriction in the protrusion of the resist pattern, and the structure can be further stabilized.

<Configuration 3>

A third configuration of the present invention is a method for manufacturing a mask blank with resist film, including:

preparing a substrate having a thin film; and forming a negative resist film on a main surface of the thin film, wherein solvent A and solvent B are contained in a resist solution used in forming a resist film, the solvent B having a higher boiling point and a lower relative dielectric constant than those of the solvent A, and the volume mixing ratio of the solvent A and the solvent B being 40:60 to 95:5;

in forming a resist film, the resist solution is applied to the main surface of the thin film, which is then dried, to thereby form a photoacid low-concentration region at a part where the resist film is in contact with the thin film;

a thickness of the photoacid generator low-concentration region is 5% to 40% of the thickness of the resist film;

a concentration of the photo acid generator at a part in contact with the thin film in the photoacid generator low-concentration region is a value obtained by decreasing the concentration of the photo acid generator in the other region of the resist film by 10% to 40%; and in the photoacid generator low-concentration region , it is sufficient that the concentration of the photoacid generator in the region of the above thickness is lower than the region of other thickness and it is not matter whether or not the concentration of the acid generator is uniform over an entire region.

According to this configuration, the same effect as described in the first configuration can be exerted. In addition, by setting the kind of the solvent of the resist solution to the abovementioned one, it becomes possible to unevenly distribute the photoacid generator in a desired form in the resist film, and the photoacid low-concentration region can be formed.

<Configuration 4>

A fourth configuration of the present invention is a method for manufacturing a transfer mask, including:

forming an uneven pattern on at least a thin film out of a mask blank using mask blank with the resist film of the first or the second configuration.

According to this configuration, the same effect as described in the first configuration can be exerted.

ADVANTAGE OF THE INVENTION

According to the present invention, it is possible to provide a technique capable of forming a good resist pattern while maintaining a high degree of freedom in designing the mask blank.

BRIEF DESCRIPTION OF THE DRAWINGS

FIG. 4 illustrates an image showing a result of evaluating the shape of the resist pattern by SEM according to example 1, wherein FIG. 4(a) illustrates an image in cross-section, and FIG. 4(b) illustrates an image in planar view.

FIG. 5 illustrates an image showing a result of evaluating the shape of the resist pattern by SEM according to example 2, wherein FIG. 4(a) illustrates an image in cross-section, and FIG. 4(b) illustrates an image in planar view.

DETAILED DESCRIPTION OF THE INVENTION

Embodiments of the present invention will be described in detail hereafter.

In this embodiment, explanation is given in the following order.

1. Mask blank with resist film
1-A) Substrate with thin film
1-B) Resist film
  1-B-a) Low-concentration region (photoacid generator low-concentration region)
2. Method for manufacturing mask blank with resist film
2-A) Preparing a substrate with thin film (mask blank)
2-B) Forming a resist film (forming a low-concentration region)

For a configuration not described below, a publicly-known configuration (for example, Japanese Patent Laid-open Publication No. 2013-257593 provided by the present applicant) may be appropriately adopted. In this specification, the contents of Japanese Patent Publication No. 2013-257593 are described regarding the matters such as the configuration, etc., of the thin film which are not particularly described.

<1. Mask blank 1 with resist film>

Figure 1:
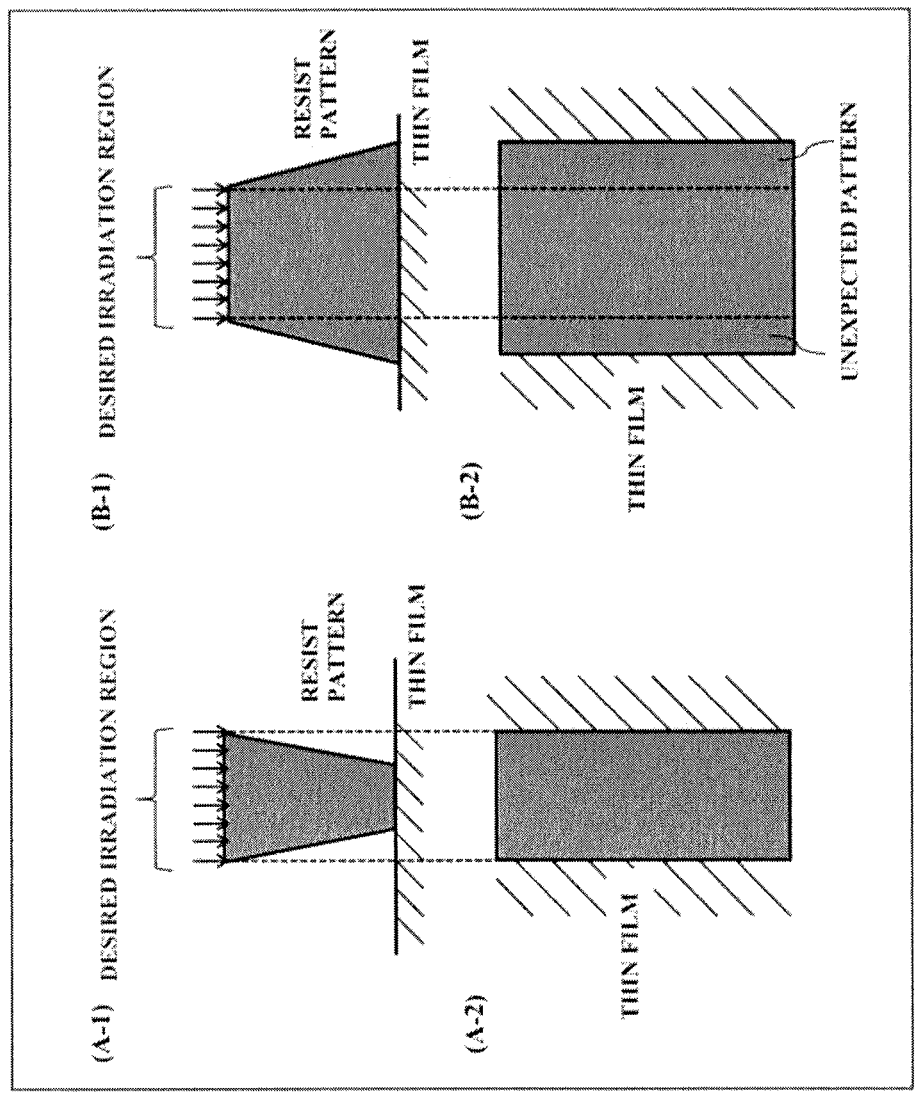
FIG. 1(A) is a schematic view illustrating a resist pattern when thinning or undercut occurs, wherein (A-1) is a cross-sectional view thereof and (A-2) is a planar view thereof.
FIG. 1(B) is a schematic view showing a case in which the root of the resist pattern becomes thicker than an outermost surface, and (B-1) is s cross-sectional view thereof and (B-2) is a plane view thereof.
Figure 2:
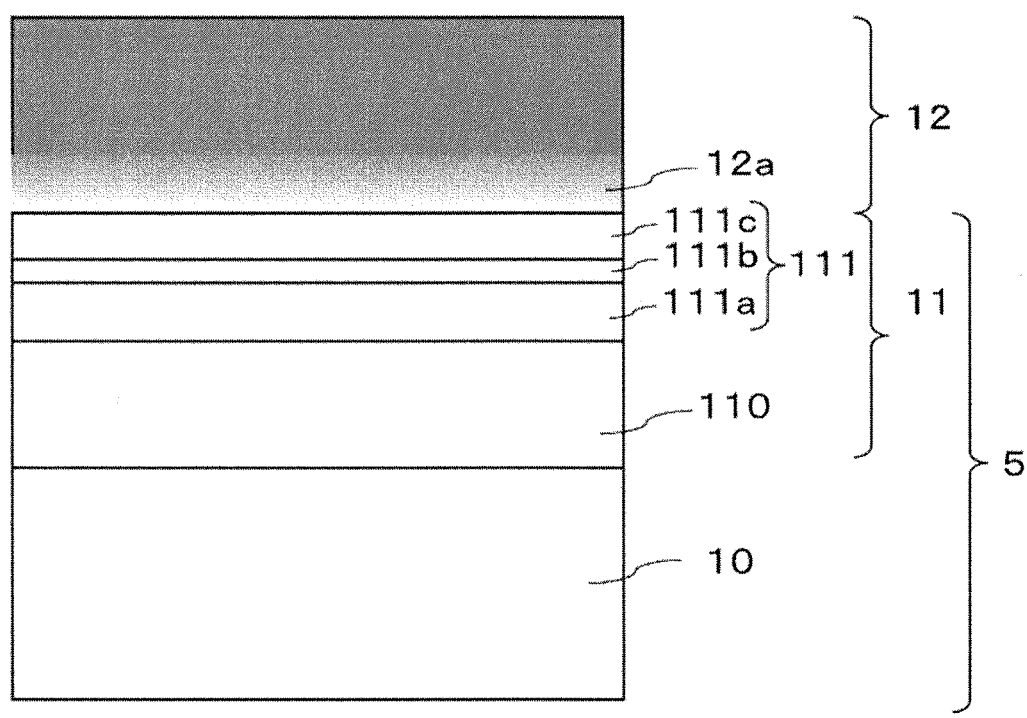
FIG. 2 is a cross-sectional schematic view of a mask blank with resist film according to an embodiment.

A mask blank 1 with resist film of this embodiment will be described using FIG. 2. FIG. 2 is a cross-sectional schematic view of a mask blank 1 with resist film according to this embodiment. As illustrated in FIG. 2, in mask blank 1 with the resist film of this embodiment, a thin film 11 is formed on a main surface of a substrate 10, and a resist film 12 is formed on the thin film 11. Each structure will be described hereafter.

1-A) Substrate with Thin Film (Mask Blank 5)

A glass substrate can be used as the substrate 10 of this embodiment. In a case of a transmitting mask, the substrate 10 is selected to be a glass material having a high transmittance for an exposure light when forming a pattern on a wafer. In a case of a reflective mask, a low thermal expansion glass is selected, which is capable of minimizing a thermal expansion of the substrate 10 caused by energy of the exposure light.

Specifically, in a case of the transmitting mask (for example, a binary mask, a phase shift mask and a gray tone mask), examples of the material of the substrate 10 include synthetic quartz glass, soda lime glass, aluminosilicate glass, borosilicate glass, and alkali-free glass, etc. As a detailed example, a synthetic quartz glass can be preferably used, which has a high transmittance for light having a wavelength of 300 nm or less is preferably used for a substrate 10 of a transfer type mask using an ArF excimer laser with a wavelength of 193 nm or a KrF excimer laser with a wavelength of 254 nm as exposure light.

In a case of an EUV mask which is a reflective mask, $SiO_2$—$TiO_2$ glass which is a glass material having a low thermal expansion coefficient within a range of about $0\pm1.0\times10^{-7}/°$ C., and more preferably in a range of about $0\pm0.3\times10^{-7}/°$ C., can be used as the substrate 10, to suppress a distortion of a pattern to be transferred due to a heat during exposure.

Next, as illustrated in FIG. 2, the thin film 11 is formed on the main surface of the substrate 10. The element constituting the thin film 11 formed on the main surface of the substrate 10 and under the resist film 12, is selected according to the purpose of use of the transfer mask manufactured from the mask blank 5. However, when the thin film 11 is a Cr film, the acid is deactivated by the Cr film. In addition, the concentration of the photoacid generator, which is the phenomenon found by the present inventor, is halved. That is, when the thin film 11 is the Cr film, thinning or undercut of the root of the resist pattern is likely to occur. In the present invention, such thinning or undercut is accepted and further utilized, and by adopting the configuration of this embodiment, a satisfactory resist pattern can be formed. However, of course, an object of the present invention is to keep high degree of freedom in selecting the thin film 11, and therefore the present invention is not limited to the case in which the thin film 11 is the Cr film. Rather, even when the thin film 11 is a Ta film or $SiO_2$ film, by setting the conditions described in the abovementioned configuration of the present invention, the satisfactory resist pattern can be formed while maintaining the high degree of freedom in designing the mask blank 5.

Specific structures of the thin film 11 can be listed as following (1) to (5).

(1) Thin Film 11 of a Binary Mask

In a case of producing a binary mask blank, the thin film 11 having a light shielding film 111 is formed on the substrate 10 having transmitting property to a light having an exposure wavelength. The light shielding film 111 is made of a transition metal simple substance such as chromium, tantalum, ruthenium, tungsten, titanium, hafnium, molybdenum, nickel, vanadium, zirconium, niobium, palladium, rhodium or the like, or a compound thereof. For example, the light shielding film 111 made of chromium or a chromium compound in which one or more elements selected from elements such as oxygen, nitrogen, carbon and the like are added to chromium, can be used. Further, the light shielding film 111 made of a tantalum compound in which one or more elements selected from elements such as oxygen, nitrogen, boron and the like are added to tantalum, can be used.

In the thin film 11, the light shielding film 111 has a two-layer structure of a light shielding layer and a main surface antireflection layer, and a three-layer structure in which a back reflection prevention layer is added between the light shielding layer and the substrate 10. Alternatively, the composition gradient film in which the composition is continuously or stepwise different in a film thickness direction of the light shielding film 111, may be selected as the thin film 11.

Alternatively, the thin film 11 may have a structure having an etching mask film on the light shielding film 111. The etching mask film is preferably made of a material composed of chromium or a chromium compound in which elements such as oxygen, nitrogen and carbon are added to chromium having etching selectivity (having etching resistance) to the etching applied to the light-shielding film 111 containing transition metal silicide. At this time, by imparting the antireflection function to the etching mask film, a transfer mask may be formed with the etching mask film remaining on the light shielding film 111.

(2) Thin film 11 of a binary mask having other structure

Further, as another example of the thin film 11 of the binary mask, a structure including the light shielding film 111 made of a material containing a compound of a transition metal and silicon (including transition metal silicide, particularly, molybdenum silicide) can also be used.

The light shielding film 111 made of a material containing a compound of the transition metal and silicon, and a material containing these transition metals and silicon, and mainly composed of oxygen and/or nitrogen can be used. Also, the light shielding film 111 made of the transition metal, and mainly composed of oxygen, nitrogen, and/or boron, can be used. As transition metals, molybdenum, tantalum, tungsten, titanium, hafnium, nickel, vanadium, zirconium, niobium, palladium, ruthenium, rhodium, chromium and the like can be used.

Particularly, when the light shielding film 111 is formed by a compound of molybdenum silicide, there are structures such as a two-layer structure of a light shielding layer (MoSi or the like) and a main surface antireflection layer (MoSiON or the like), and a three-layer structure of a backside antireflection layer (such as MoSiON) between the light shielding layer and the substrate 10.

Alternatively, the composition gradient film may be used as the light shielding film 111, in which the composition is continuously or stepwise different in its film thickness direction.

(3) Thin Film 11 of a Halftone Type Phase Shift Mask

When the halftone type phase shift mask is produced, the thin film 11 is formed on the substrate 10 having a light transmitting property to the wavelength of the exposure light used during transfer, the thin film 11 having a light semi-transmitting film 110 made of a material containing a compound of the transition metal and silicon (including transition metal silicide, and particularly molybdenum silicide).

The light semi-transmitting film 110 included in the thin film 11 transmits the light having an intensity that does not substantially contribute to exposure (for example, 1% to 30% of the exposure wavelength), and has a predetermined phase difference (for example, 180 degrees). The halftone type phase shift mask has a light semi-transmitting portion obtained by patterning the light semi-transmitting film 110, and a light transmitting portion for transmitting a light having an intensity that substantially contributes to exposure in which the light semi-transmitting film 110 is not formed. As a result, a phase of a light that transmits through the light semi-transmitting portion and a phase of a light that transmits through the light transmitting portion are substantially inverted with each other, so that the lights which have passed through the vicinity of a boundary part between the light semi-transmitting portion and the light transmitting portion and diffracted to the other region by a diffraction phenomenon cancel out each other, and the light intensity at the boundary part is made substantially zero to improve the contrast or resolution at the boundary part.

The light semi-transmitting film 110 is made of a material containing the compound of the transition metal and silicon (including a transition metal silicide) for example, the material containing these transition metals and silicon, and mainly composed of oxygen and/or nitrogen can be used. As the transition metals, molybdenum, tantalum, tungsten, titanium, hafnium, nickel, vanadium, zirconium, niobium, palladium, ruthenium, rhodium, chromium and the like can be used.

In a case of a structure including the light shielding film 111 on the light semi-transmitting film 110, since the material of the light semi-transmitting film 110 contains the transition metal and silicon, particularly chromium having etching selectivity (having etching resistance) to the light semi-transmitting film 110, and the chromium compound in which elements such as oxygen, nitrogen, and carbon are added to chromium, are preferably used as the material of the light shielding film 111.

(4) Thin Film 11 of a Multi-Tone Mask

The thin film 11 of a multi-tone mask has a lamination structure of one or more semi-transmitting films and the light shielding film 111.

The material of the semi-transmitting film includes simple metals such as chromium, tantalum, titanium and aluminum, alloys or compounds thereof, in addition to the same elements as those of the light semi-transmitting film 110 of the halftone type phase shift mask blank.

The composition ratio and the film thickness of each element are adjusted so as to obtain a predetermined transmittance to the exposure light. For the material of the light shielding film 111 of the binary mask blank, the material of the light shielding film 111 can be used, and in the lamination structure including the semi-transmitting film, the material composition and the film thickness of the light shielding film 111 are adjusted so as to obtain a predetermined light shielding performance (optical density).

(5) Thin film 11 of a reflective mask

The thin film 11 of the reflective mask has a structure in which a multilayer reflective film that reflects the exposure light is formed on the substrate 10 and an absorber film that absorbs the exposure light is formed on the multilayer reflective film in a patterned shape. Light (EUV light) incident on the reflective mask mounted on an exposure machine (pattern transfer device) is absorbed at a portion where the absorber film is present, and a light image reflected by the multilayer reflective film is transferred to a semiconductor substrate through a reflection optical system.

The multilayer reflective film is formed by alternately laminating a high refractive index layer and a low refractive index layer. Examples of the multilayer reflective film, include a Mo/Si cyclic laminated film in which Mo film and Si film are alternately laminated by about 40 cycles, Ru/Si cyclic multilayer film, Ru/Si cyclic multilayer film, Mo/Be cyclic multilayer film, Mo compound/Si compound cyclic multilayer film, Si/Nb cyclic multilayer film, Si/Mo/Ru cyclic multilayer film, Si/Mo/Ru/Mo cyclic multilayer film, Si/Ru/Mo/Ru cyclic multilayer film, and the like. The material can be suitably selected depending on the exposure wavelength.

Further, the absorber film has a function of absorbing, for example, EUV light which is the exposure light, and for example, a material containing tantalum (Ta) as a simple substance or a material containing Ta as a main component can be preferably used. The crystalline state of such an absorber film is preferably has an amorphous or microcrystalline structure from a viewpoint of smoothness and flatness.

1-B) Resist Film 12

Next, as illustrated in FIG. 2, a resist film 12 is formed on the thin film 11 of the mask blank 5.

1-B-a) Photoacid Generator Low-Concentration Region

In the resist film 12, a layered photoacid generator low-concentration region 12a (hereinafter simply referred to as "low-concentration region 12a") is formed at a portion where the resist film 12 is in contact with the thin film 11.

In this specification, the "low-concentration region 12a" refers to a "region where the concentration of the photoacid generator is low compared to other region of the resist film 12". More specifically, "other region of the resist film 12" refers to a region other than the low-concentration region 12a of the resist film 12. That is, the "region where the concentration of the photoacid generator is low compared to other region" means that the concentration of the photoacid generator when viewed from the entire low-concentration region 12a is lower than the concentration of the photoacid generator when viewed from the entire region other than the low-concentration region 12a in the resist film 12. In other words, even if a layer having a low photoacid generator concentration is formed thin in the vicinity of the outermost surface in the resist film 12, separately from the low-concentration region 12a, the concentration of the photoacid generator when viewed from the entire region above the low-concentration region 12a, is still high compared to the concentration of the photoacid generator when viewed from the entire low-concentration region 12a, and this case also belongs to a technical scope of the present invention.

The above definition is effective for setting the following conditions in this embodiment.

The concentration of the photoacid generator at the portion in contact with the thin film 11 in the low-concentration region 12a is expressed by a value obtained by decreasing the concentration of the photo acid generator in the other region of the resist film 12 by 10% to 40%.

"Other region of the resist film 12" is the region as described above, and the value obtained by decreasing the concentration of the photoacid generator in the entire other region by 10% to 40%, is the concentration of the photoacid generator at the portion in contact with the thin film 11 in the low-concentration region 12a. By setting the concentration in this range, it is possible to form a satisfactory resist pattern in planer view without causing excessive thinning or undercut.

In many cases, the photoacid generator is uniformly dispersed in the region other than the low-concentration region 12a in the resist film 12, and therefore the above definition can be said as follows in other words.

The concentration of the photoacid generator at the portion in contact with the thin film 11 in the low-concentration region 12a is expressed by the value obtained by decreasing the concentration of the photoacid generator by 10% to 40% at the portion where other region of the resist film 12 and the low-concentration region 12a are in contact with each other.

At that time, the thickness of the low-concentration region 12a is set to be 5% to 40% (preferably 10% to 35%) of the thickness of the entire resist film 12. By setting the thickness of the low-concentration region 12a within this range, it is possible to properly balance the elevation of the protrusion of the resist pattern, and the collapse of the pattern can be suppressed without generating the excessive thinning or undercut.

The above contents are the contents of each layer constituting the resist film 12. Specific compounds and amounts constituting each layer (region) are listed below. In this specification, for example, "10% to 40%" means a prescribed numerical value (10%) or more and prescribed numerical value (40%) or less. Further, the compounds listed below may be used alone, or a combination of these compounds may be used.

(Negative Resist)

A publicly-known one may be used as the negative resist of this embodiment. For example, a negative chemically amplified resist described in JP-A-2014-106299 may be used.

(Crosslinking Agent)

Examples of the crosslinking agent include alkoxymethylglycolurils and alkoxymethylmelamines. Specific examples thereof include tetramethoxymethylglycoluril, 1,3-bismethoxymethyl-4,5-bismethoxyethylene urea, bis Methoxymethyl urea, hexamethoxymethyl melamine, hexaethoxymethyl melamine, and the like.

0.5 to 5 parts by mass of the crosslinking agent is preferably contained in the negative resist based on 100 parts by mass of polymer, as an amount of the crosslinking agent. Within this range, the function of the negative resist can be sufficiently exerted, and also reduction of the resolution due to curing of an unexposed portion, can be stopped.

(Photoacid Generator)

Examples of the photoacid generator include compounds described in JP-A No. 2013-164588, onium salts such as diazonium salts, sulfonium salts and iodonium salts, organic halogen compounds, photoacid generators having an o-nitrobenzyl type protective group, iminosulfonate compounds, disulfone compounds, diazoketosulfonic acid, diazodisulfone compounds, oxime sulfonate compounds, and the like.

2 to 20 parts by mass (preferably 5 to 15 parts by mass.) of the photoacid generator is preferably contained in the negative resist based on 100 parts by mass of polymer, as an amount of the pohotoacid generator. Within this range, the function of the negative resist can be sufficiently exerted, and also reduction of the resolution due to curing of an unexposed portion, can be stopped.

(Basic Compound)

Examples of the basic compound include primary, secondary and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroyphenyl group, alcoholic nitrogen-containing compounds, amids, imides, carbamates, ammonium salts, and the like.

Particularly preferred basic compounds include tris (2-(methoxymethoxy) ethyl) amine, tris (2-(methoxymethoxy) ethyl) amine N-oxide, morpholine derivative, imidazole derivative and the like.

0.01 to 5 parts by mass (preferably 0.05 to 3 parts by mass.) of the basic compound is preferably contained in the negative resist based on 100 parts by mass of polymer, as an amount of the basic compound. Within this range, the function of the negative resist can be sufficiently exerted, and also reduction of the resolution due to curing of an unexposed portion, can be stopped.

(Solvent)

Solvents include an organic solvent capable of dissolving a polymer compound, an acid generator, and other additives, etc., such as ketones such as methyl isobutyl ketone, cyclohexanone and 2-heptanone, ethers such as propylene glycol monomethyl ether (PGME, aka 1-methoxy-2-propanol), propylene glycol monoethyl ether, ethylene glycol monomethyl ether, ethylene glycol monoethyl ether, propylene glycol dimethyl ether, diethylene glycol dimethyl ether, esters such as methyl 3-methoxypropionate, ethyl 3-ethoxypropionate, methyl β-methoxyisobutyrate, ethyl butyrate, propyl butyrate, propylene glycol monomethyl ether acetate (PGMEA, also known as 1-methoxy-2-acetoxypropane), propylene glycol monoethyl ether Acetate, ethylene glycol monomethyl ether acetate, ethyl acetate, isoamyl acetate, ethyl lactate, butyl acetate, tert-butyl acetate, tert-butyl propionate, propylene glycol mono tert-butyl ether acetate, cyclohexyl acetate, alcohols such as 3-methoxybutanol, 3-methyl-3-methoxybutanol, 1-methoxy-2-propanol, diacetone alcohol, and in addition, N-methyl pyrrolidone, N, N-dimethylformamide, γ-butyrolactone, N, N-dimethylacetamide, propylene carbonate, ethylene carbonate, toluene, xylene, and the like.

In this embodiment, the solvent constituting the resist solution also has a typical feature. As the solvent of the resist solution of this embodiment, solvent B having a higher boiling point and a lower relative dielectric constant than solvent A is selected, with solvent A which is a main solvent selected as a reference.

The solvent ratio is appropriately decided according to a difference of the boiling points, vapor pressures, and the relative dielectric constants between the solvent A and the solvent B. For example, when the difference of the boiling points between the solvent A and the solvent B is small and the difference of the vapor pressures between the solvent A and the solvent B at the baking temperature is small, the volume ratio of the solvent B (the same applies hereinafter) may be adjusted to be higher. For example, solvent A: solvent B=60:40 to 70:30 is preferable. By adopting such allocation, the ratio of the solvent can be adjusted so that the solvent remained finally on the substrate 10 side in the depth direction of the resist film 12 is mainly the solvent B. When the difference of vapor pressures between solvent A and solvent B is large, it is preferable to adjust the ratio of solvent B to be low. For example, solvent A: solvent B=85:15 to 95:5 is preferable. When the ratio of the solvent B is too small, evaporation of the solvent B may be completed earlier than the solvent A. In this case, the concentration of the photoacid generator in the resist film 12 becomes lower on the thin film 11 side, and this is not preferable.

Further, as illustrated in examples described later, it is found by the inventors of the present invention that the volume ratio of the solvent A to the solvent B has a preferable range.

As a result, it is preferable that the volume ratio of solvent A to solvent B as a preferred example is summarized as follows: Solvent A: Solvent B=(40:60) namely 4:6 to (95:5) namely 19:1.

In addition, when the difference of the relative dielectric constants between solvent A and solvent B is large, it is necessary to increase the ratio of solvent A. This is because depending on a perspiration state of the solvent A, there is a possibility that the photoacid generator is excessively increased on the surface side of the resist film 12 or the photoacid generator concentrates and precipitates at a specific position in the film thickness direction. In brief, by properly adjusting the ratio of solvent A and solvent B based on a relation between the boiling point and the relative dielectric constant, a distribution state of the photoacid generator can be established in the resist film 12 of the present invention.

Although various combinations of solvent A and solvent B can be considered, examples of the combinations found by the present inventor so far are as illustrated in Table 1 below.

TABLE 1

| | Solvent A (BP = Boiling point (° C.), ∈ = Relative dielectric constant) | Solvent B (BP = Boiling point (° C.), ∈ = Relative dielectric constant) | A:B (Volume ratio) |
| --- | --- | --- | --- |
| Specific example 1 | PGME (Bp: 118° C., ∈: 16) | PGMEA (BP: 146° C., ∈: 8) | 80:20 |
| Specific example 2 | Ethylene glycol monomethyl ether (BP: 124° C., ∈: 16) | PGMEA (BP: 146° C., ∈: 8) | 70:30 |
| Specific example 3 | Cyclohexanone (Bp: 116° C., ∈: 18) | Propyl acetate (Bp: 142° C., ∈: 4) | 85:15 |
| Specific example 4 | PGME (Bp: 118° C., ∈: 16) | Ethyl lactate (Bp: 155° C., ∈: 13) | 60:40 |

In addition to the solvent A and the solvent B, other solvents may be contained, but it is preferable that the ratio of the solvent A and the solvent B to the total solvent is 95 vol % (volume ratio) or more of the total solvent.

Regarding the solvent B, it is preferable that the solvent B has a higher boiling point and a lower relative dielectric constant than other solvents.

Meanwhile, the inventors of the present invention are intensively studying the reason why the combination of the solvent A and the solvent B as described above is preferable. Although it is speculation, the following reasons are conceivable.

First, since the solvent A has a boiling point lower than that of the solvent B, the solvent A easily volatilizes during baking, and the solvent A moves to the outermost surface side of the resist film 12. Relatively, the solvent B moves to the side where the resist film 12 and the thin film 11 are in contact with each other. When the baking is finished in this state, the dried solvent A having a high dielectric constant is arranged on the outermost surface side of the resist film 12. On the other hand, a dried solvent B having a low dielectric constant is arranged in the vicinity of the thin film 11 of the resist film 12.

When a photoacid generator having polarity is used, it is supposed to move to the solvent A having a high relative dielectric constant. As a result, the concentration of the photoacid generator is high on the outermost surface side of the resist film 12, and conversely, the concentration of the photo acid generator is low in the vicinity of the thin film 11 of the resist film 12. When exposure (drawing) by electron beam irradiation is performed in this state, exposure does not proceed much in the vicinity of the thin film 11 of the resist film 12, and thinning and undercut can be caused when the resist pattern is finally formed.

However, when the thin film 11 is made of a Cr-based compound, the concentration of the photoacid generator is halved in the vicinity of the thin film 11. As a countermeasure, the photoacid generator is hardly allowed to move toward the solvent A, to thereby easily send the photoacid generator to the vicinity of the thin film 11 as a reinforcement. For example, it is also conceivable to use the photoacid generator having no polarity.

Among the abovementioned compounds, ethyl lactate, propylene glycol monomethyl ether, propylene glycol monomethyl ether acetate or the like having the best solubility of the photo acid generator is preferably used as the solvent for forming the low-concentration region 12a. By using these solvents, precipitation (segregation) of the acid generator in the resist film 12 can be suppressed.

The amount of the solvent used in this embodiment is preferably from 1,000 to 10,000 parts by mass, particularly preferably from 2,000 to 9,700 parts by mass, based on 100 parts by mass of the whole polymer. By adjusting the concentration to such a level, it is possible to stably obtain the resist film 12 having a film thickness of 10 to 300 nm with good flatness by using a spin coating method.

This embodiment shows the example in which the resist film 12 is formed of a single layer and simply has the low-concentration region 12a, but the resist film 12 may be formed of a plurality of layers. For example, a layer a in which the photoacid generator is dilute is formed on the main surface of the thin film 11, a layer β in which the photoacid generator is slightly thickened is formed on the main surface of the layer α, and a layer β in which the photoacid generator is further thickened is formed on the main surface of the layer β . . . . Thus, the resist film 12 may be composed of a plurality of layers.

On the other hand, from a viewpoint of stabilizing the structure of the protrusion of the resist pattern, it is preferable to gradually decrease the concentration of the photoacid generator in the thickness direction from the resist film 12 toward the thin film 11 in the low-concentration region 12a. When the concentration of the photoacid generator is gradually decreased, it is not necessary to cause constriction in the protrusion of the resist pattern, and the structure can be further stabilized. Of course, the structure of this gradually decreasing region may be combined with the above-mentioned structure of a plurality of layers. That is, the low-concentration region 12a may have a portion where the concentration of the photoacid generator gradually decreases in the thickness direction from the resist film 12 toward the thin film 11.

Those including the above structure are collectively referred to as the low-concentration region 12a. However, hereinafter, explanation will be given for an example of a case in which the low-concentration region 12a is a gradually decreasing region.

Incidentally, as long as the low-concentration region 12a is secured, all layers constituting the resist film 12 are not required to include the negative resist. For example, not a negative resist but a mere thermosetting resin containing a small amount of a photoacid generator is provided on the main surface of the thin film 11 as a resist underlayer, and a negative resist having an ordinary amount of a photoacid generator may be applied and baked thereon. In other words, in this embodiment, the resist film including a resist underlayer which is a layer provided at a portion in contact with the thin film 11 and serves as a base in the resist film 12, is referred to as the "resist film 12".

The main structure of mask blank 1 with the resist film of this embodiment has been described above. Other publicly-known layers (films) may be provided on the mask blank 5 as long as they have the above structure. For example, a protective film may be provided on the main surface of the resist film 12.

<2. Method for Manufacturing Mask Blank 1 with the Resist Film>

Figure 3:
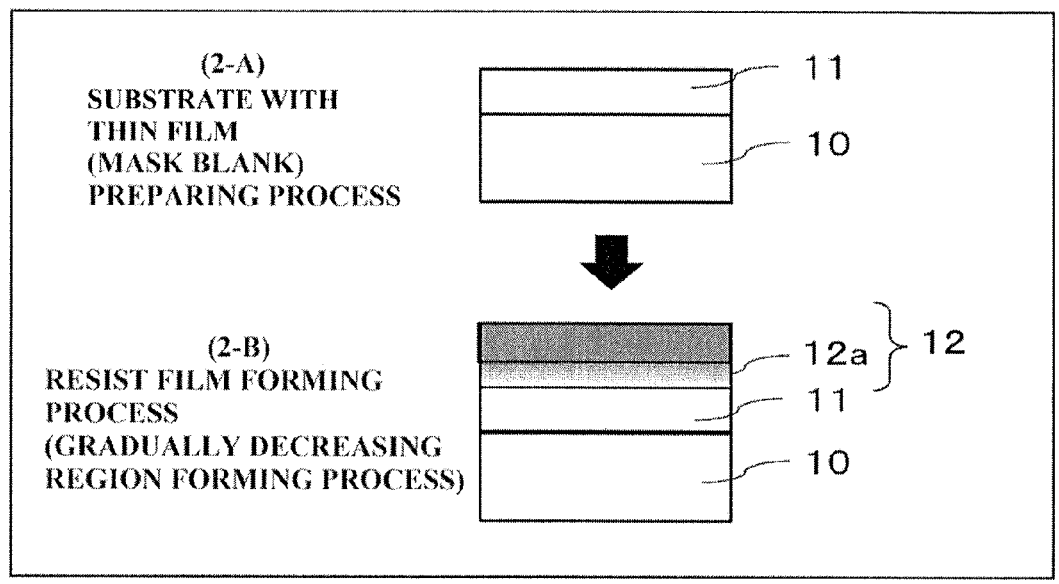
FIG. 3 is a cross-sectional schematic view illustrating a method for manufacturing mask blank with the resist film according to an embodiment.

Next, a method for manufacturing mask blank 1 with the resist film of this embodiment will be described, with reference to FIG. 3. FIG. 3 is a schematic cross-sectional view illustrating the method for manufacturing mask blank 1 with the resist film of this embodiment. Some of the contents of the following steps is overlapped with the content described in <1. Mask blank 1 with resist film>. Therefore, for contents not described below, explanation is already given in <1. Mask blank 1 with resist film>.

This embodiment shows an example of preparing the substrate 10 and forming the thin film 11 on the substrate 10 in the following 2-A) Preparing substrate with the thin film. However, the following embodiment is also included in the embodiment of the present invention: the mask blank 5 with the thin film 11 formed thereon is prepared in advance, and the resist film 12 is formed thereon.

2-A) Preparing substrate with the thin film (mask blank 5)

First, the substrate 10 is prepared. Next, the thin film 11 is formed on the main surface of the substrate 10. A publicly-known method may be used as for a specific structure and for preparing substrate with the thin film. This embodiment shows a case in which the semi-transmitting film 110 and the light-shielding film 111 are provided on the substrate 10 made of quartz glass, and such substrate with thin film is used as the mask blank 5.

2-B) Forming the Resist Film (Forming the Low-Concentration Region)

In this process, the resist film 12 is formed on the main surface of the thin film 11 using a chemically amplified resist (negative resist). The low-concentration region 12a is formed at this time. Specific method is as follows. First, solvent A and solvent B are prepare, which are listed in the item of the solvent of the resist solution, and they are mixed at the volume ratio within the above range, and the resist solution to which the photoacid generator is added, is applied on the main surface of the thin film 11, which is then baked. As a result, the low-concentration region 12a is formed, in which the concentration of the photoacid generator is gradually decreased downward.

It can be said that the technical feature of the present invention is reflected on the resist solution (resist composition) containing solvent A and solvent B listed in the item of the solvent of the resist solution, in the point that the low-concentration region 12a can be formed irrespective of the type of the thin film 11. The structure of this resist composition will be briefly described as follows.

"There is provided the resist composition containing solvent A and solvent B, wherein the solvent B has a boiling point higher than that of the solvent A and a lower relative dielectric constant, and the volume mixing ratio of the solvent A and the solvent B being 40:60 to 95:5."

As described above, mask blank 1 with the resist film of this embodiment is produced. Of course, a washing/drying process, etc., required for producing mask blank 1 with the resist film may be performed as appropriate.

The transfer mask may be produced from the above mask blank 1 with the resist film. Exposure corresponding to the shape of a predetermined pattern is applied to the above-mentioned mask blank 1 with the resist film, and thereafter the process of forming a resist pattern by development is performed, and finally the thin film 11 having a predetermined uneven pattern is produced. The process of forming a pattern here may refer to forming a resist pattern and may also refer to forming an uneven pattern on the thin film 11 and the substrate 10 themselves. In this case as well, the washing/drying process, etc., required for producing the transfer mask may be performed as appropriate.

EXAMPLES

Next, the present invention will be described in detail by showing examples. Of course, the present invention is not limited to the following examples. As for matters which are not mentioned in particular, the contents described in JP-A No. 2013-257593 is adopted.

Example 1

(Preparation of a Sample)
2-A) Preparing Substrate with Thin Film (Mask Blank 5)

A light-transmitting substrate 10 (hereinafter also referred to as light-transmitting substrate 10) made of synthetic quartz glass having a main surface dimension of about 152 mm×about 152 mm and a thickness of about 6.25 mm was prepared.

First, the light semi-transmitting film 110 was formed on the light-transmitting substrate 10.

A single wafer type sputtering apparatus was used, and a mixed target (mol % ratio of Mo: Si=10:90) of molybdenum (Mo) and silicon (Si) was used as a sputtering target, and a mixed gas of argon (Ar), nitrogen ($N_2$), and helium (He) (flow ratio Ar:$N_2$:He=5:49:46, pressure=0.3 Pa) was used as a sputtering gas, to thereby form MoSiN film (underlayer) on the substrate 10 made of synthetic quartz glass, with a film thickness of 69 nm, by reactive sputtering (DC sputtering: DC power 3.0 kW).

Subsequently, heat treatment was applied to the substrate 10 on which the MoSiN film was formed, using a heating furnace in the atmosphere at a heating temperature of 450° C. and a heating time of 1 hour. The MoSiN film had a transmittance of 6.16% and a phase difference of 184.4 degrees, obtained by ArF excimer laser.

Next, the light-shielding film 111 having a three-layer structure was formed on the light semi-transmitting film 110.

A single wafer type DC sputtering apparatus was used, a chromium (Cr) target was used, and a mixed gas of argon (Ar), carbon dioxide ($CO_2$), nitrogen ($N_2$) and helium (He) (flow ratio Ar:$CO_2$:$N_2$:He=20:35:10:30, pressure: 0.2 Pa) was used as a sputtering gas, to thereby form CrOCN film (first light-shielding film 111a) with a film thickness of 30 nm, by reactive sputtering (DC sputtering: DC power 1.7 kW).

The same chromium (Cr) target was used, and a mixed gas of argon (Ar) and nitrogen ($N_2$) (flow ratio Ar:$N_2$=25:75, pressure=0.1 Pa) was used as a sputtering gas, to thereby form CrN film (second light-shielding film 111b) on the first light-shielding film 111a, with a film thickness of 4 nm, by reactive sputtering (DC sputtering: DC power 1.7 kW).

The same chromium (Cr) target was used, and a mixed gas of argon (Ar), carbon dioxide ($CO_2$), nitrogen ($N_2$), and helium (He) (flow ratio Ar:$CO_2$:$N_2$:He=20:35:5:30, pressure=0.2 Pa) was used as a sputtering gas, to thereby form a chromium-rich CrOCN film (third light-shielding film 111c) on the second light-shielding film 111b, with a film thickness of 14 nm, by reactive sputtering (DC sputtering: DC power 1.7 kW).

Through the above procedure, the light-shielding film 111 made of a chromium-based material having a three-layer structure of a lowermost layer made of CrOCN, a lower layer made of CrN, and an upper layer made of CrOCN, was formed with a total film thickness of 48 nm from the phase shift film side.

Through the above procedure, substrate with the thin film was obtained. An optical density when the light semi-transmitting film 110 and the light-shielding film 111 were combined, was 3.0 (λ=193 nm). Further, a surface reflectance of the light-shielding film 111 to the wavelength of the exposure light (λ=193 nm) was 20%.

2-B) Forming the Resist Film (Forming the Low-Concentration Region)

First, PGME (solvent A) and PGMEA (solvent B) were used as the resist solution used in this example and a comparative example, to thereby prepare six kinds of mixed solvents (examples 1 to 4, and comparative examples 1 to 2). Subsequently, a polystyrene resin derivative (photosensitive resin), a crosslinking agent and 4-methylphenyl diphenyl sulfonium nonafluorobutane sulfonate (photo acid generator) (WPAG-469 manufactured by Wako Pure Chemical Industries, Ltd.) were dissolved in the mixed solvent, to thereby prepare the resist solution. The mass ratio of the photoacid generator to the photosensitive resin was set to as follows: photo acid generator: photosensitive resin=10:100.

The adjustment contents of the resist solution in each example and each comparative example are described in the following Table 2.

TABLE 2

| | PGME:PGMEA (Solvent A:Solvent B) (Volume ratio) | X | Y |
| --- | --- | --- | --- |
| Example 1 | 40:60 | 34 | 39 |
| Example 2 | 60:40 | 27 | 31 |
| Example 3 | 80:20 | 22 | 22 |
| Example 4 | 90:10 | 11 | 10 |
| Com. Ex. 1 | 20:80 | 38 | 49 |
| Com. Ex. 2 | 96:4 | 10> | 3> |

Com. Ex. = Comparative example
X = Thickness of a gradually decreasing region (nm from the thin film)
Y = Gradually decreasing ratio (%) of the concentration of the photoacid generator Each resist solution was applied on the surface of the thin film 11 by a spin coat method and then baked at 130° C. for 600 seconds, to thereby form the resist film 12 having a thickness of 100 nm.

Using the above method, mask blank 1 with the resist film of this example was produced.

The gradually decreasing ratio of the concentration of the photoacid generator in Table 2 was determined by TOF-SIMS (time-of-flight secondary ion mass spectrometry). More specifically, according to this example, the concentration of the photoacid generator is substantially constant in the case of the resist film 12 above the low-concentration region 12a, and how much the concentration of the photoacid generator at the part in contact with the thin film 11 in the low-concentration region 12a, is decreased from such approximately constant value, was calculated from the intensity ratio of TOF-SIMS.

Further, the thickness of the low-concentration region 12a was similarly obtained by TOF-SIMS.

More specifically, the thickness from a starting point of the gradual decrease of the concentration of the photoacid region 12a, to the thin film 11, was defined as the thickness of the low-concentration regino 12a.

(Evaluation)

Thereafter, the pattern was drawn on the resist film 12 using an electron beam drawing apparatus manufactured by Elionix Co., Ltd. For example, the pattern was exposed so that the width (half pitch) of the protrusion (line) of the resist pattern was 65 nm and the ratio of line to space was 1:1, and heat treatment was applied thereto at 130° C. for 600 seconds after drawing. Subsequently development was performed. Development was performed by supplying a developing solution (THAM: tetramethylammonium hydroxide) to the substrate 10 at 5 mL/sec.

Thereafter, drying rotation was performed for 60 seconds at high speed rotation and air drying was performed. The process after removal of the resist pattern was not performed.

Figure 4:
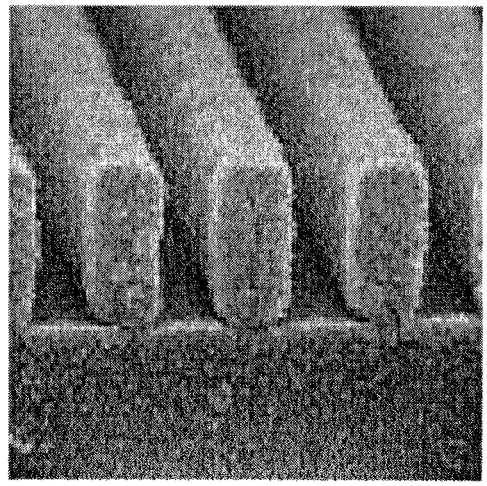
Figure 4:
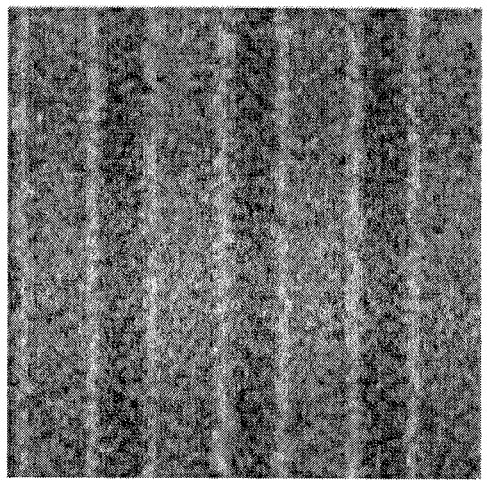
Figure 5:
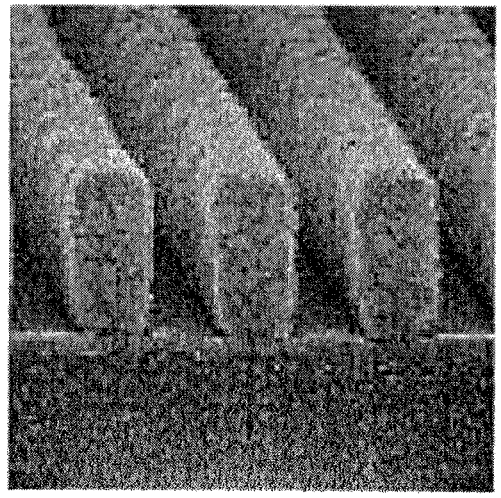
Figure 5:
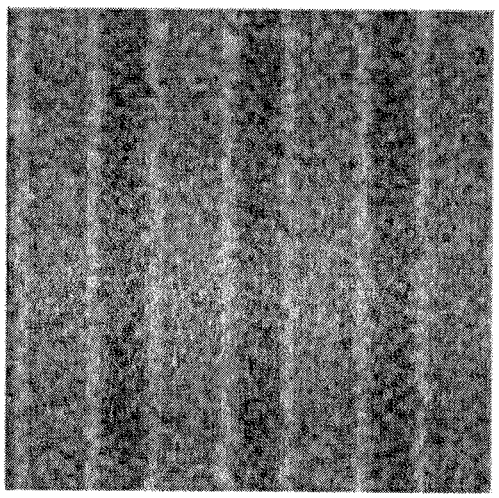
Figure 6:
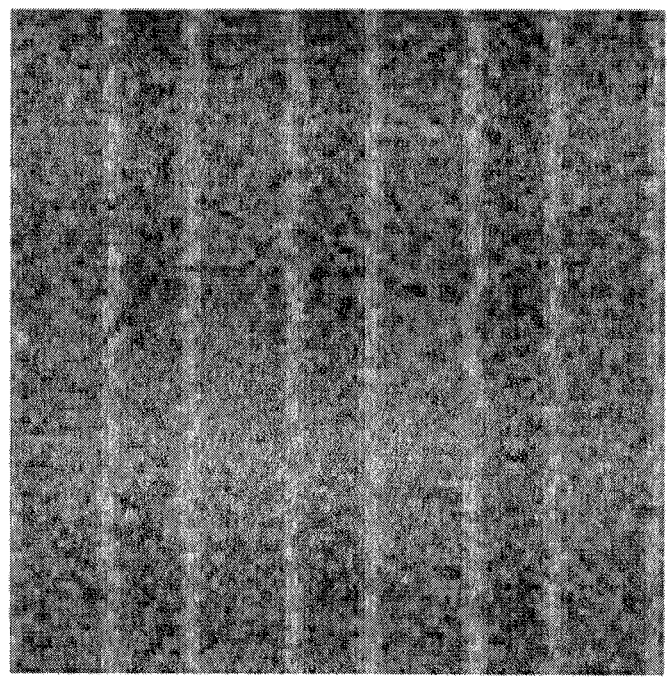
FIG. 6 illustrates an image showing a result of evaluating a planar shape of the resist pattern according to example 4.
Figure 7:
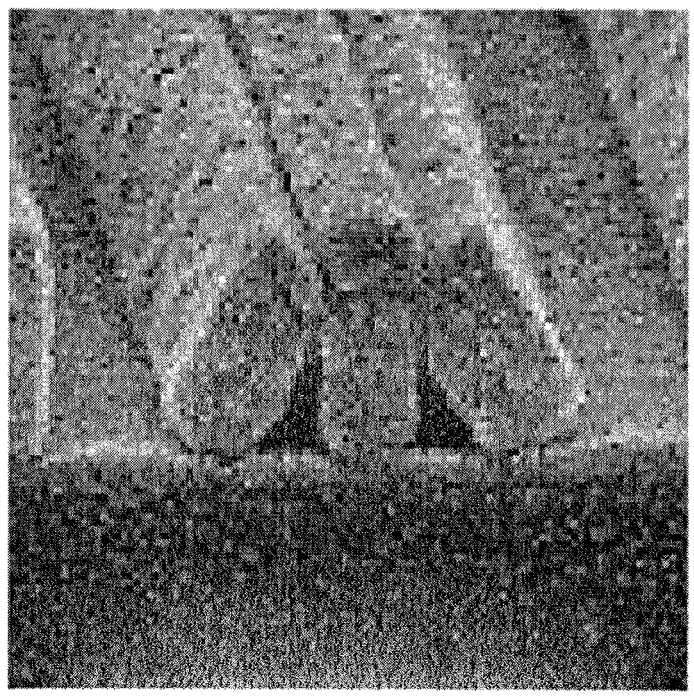
FIG. 7 illustrates an image showing a result of evaluating a cross-sectional shape of the resist pattern according to comparative example 1.
Figure 8:
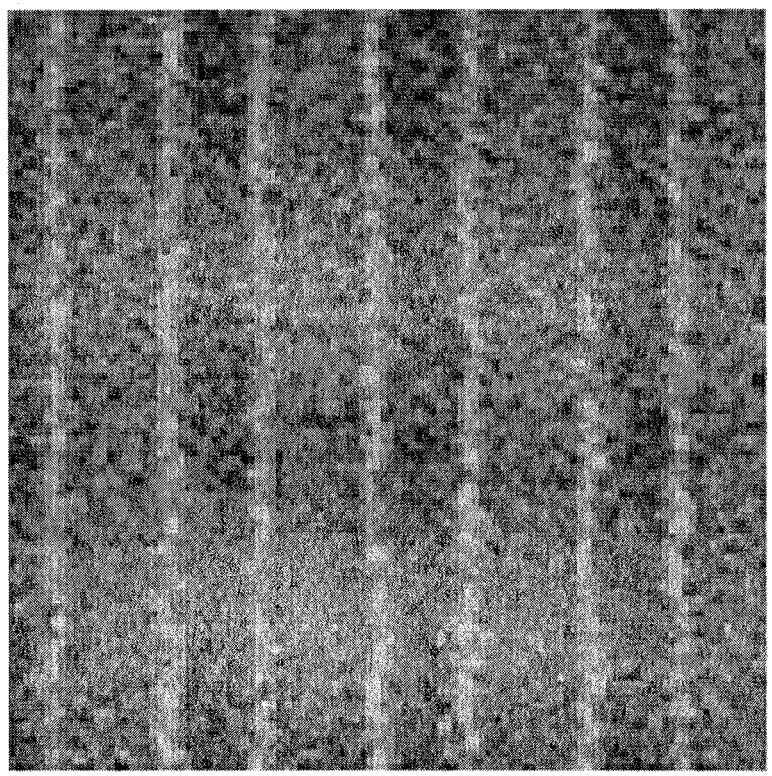
FIG. 8 illustrates an image showing a result of evaluating a planar shape of the resist pattern according to comparative example 2.

For the sample thus obtained, the cross-sectional shape of the resist pattern was evaluated by SEM. FIG. 4 to FIG. 8 illustrate the results thereof. FIG. 4 illustrates the result of example 1, wherein (a) illustrates an image in cross-section, and (b) illustrates an image in planar view. FIG. 5 illustrates the result of example 2, wherein (a) illustrates an image in cross-section, and (b) illustrates an image in planar view. FIG. 6 illustrates an image in planar view according to example 4. On the other hand, FIG. 7 illustrates an image in cross-section according to comparative example 1, and FIG. 8 illustrates an image in planar view according to comparative example 2.

LER (Line Edge Roughness), which is an index indicating dimensional variations of patterns, was measured for each resist pattern of each example and each comparative example.

For each resist pattern of each example and each comparative example, LER (Line Edge Roughness), which is an index showing the dimensional variation of the pattern, was measured.

TABLE 3

| | LER (nm) |
|---|---|
| Example 1 | 4.4 |
| Example 2 | 4.8 |
| Example 3 | 4.77 |
| Example 4 | 4.8 |
| Com. Ex. 1 | Collapse |
| Com. Ex. 2 | 5.9 |

Com. Ex. = Comparative example

As a result, for examples 1 to 4, it was found that 10% to 40% of decrease in the concentration of the photoacid generator occurred, the LER was improved and the resolution was high, and a good resist pattern was obtained.

On the other hand, in comparative example 1 in which the decrease in the concentration of the photoacid generator reached about 50%, the undercut became too deep and pattern collapse occurred.

Further, in comparative example 2 in which the concentration of the photoacid generator was decreased to an excessively low value of less than 3%, the LER was increased to 5.5 nm or more, resulting in poor resolution.

As a result, it was found that the resolution was improved when the concentration of the photoacid generator gradually decreased from 10 to 40% toward the vicinity of the thin film 11 as shown in this example.

Further, it was found that when the thickness of the low-concentration region 12a was 5% to 40% (especially 10% to 35%) of the thickness of the resist film 12, the resolution was improved. On the other hand, when the thickness of the low-concentration region 12a was out of the above range, the resolution deteriorated.

<Modified Example>

In this modified example, two kinds of resist composition solutions having different concentrations of the photo acid generator were prepared to produce a resist-attached mask blank having two layers of resist layers differing in the content ratio of the photo acid generator.

The structure of substrate with the thin film is similar to that of the above-described embodiment.

First, a polystyrene resin derivative (photosensitive resin), a crosslinking agent, and 4-methylphenyl diphenylsulfonium nonafluorobutanesulfonate (photo acid generator) (WPAG-469 manufactured by Wako Pure Chemical Industries, Ltd.) were dissolved in PGMEA, to prepare a resist solution. The lower layer (thin film side) resist solution (lower layer side resist solution) was prepared by setting the weight ratio of the photo acid generator to the photosensitive resin to 7:100 (photo acid generator: photosensitive resin =7:100), and in the resist solution of an upper layer (upper layer side resist solution), the mass ratio of the photoacid generator to the photosensitive resin was set to photoacid generator : photosensitive resin =10:100.

Next, the lower layer side resist solution was applied on the thin film to form a lower layer side resist layer having a thickness of 30 nm, and thereafter bake treatment was applied thereto at 130° C. for 300 seconds.

Next, the upper side resist solution was applied on the surface of the lower side resist layer, to form an upper side resist layer having a thickness of 70 nm, and thereafter bake treatment was applied thereto at 130° C. for 600 seconds. In this way, a resist layer having a total thickness of 100 nm was formed.

Thereafter, when the resist pattern was formed in the same manner as in the example, LER was 4.8 nm. In view of this point, it was found that the resolution was improved by forming the resist film in a multi-layer structure and by more decreasing the PAG concentration of the thin film side resist layer than the surface side (upper layer side).

DESCRIPTION OF SIGNS AND NUMERALS

1 Mask blank with resist film
5 Mask blank
10 Substrate
11 Thin film
110 Light semi-transmitting film
111 Light shielding film
111a First light shielding film
111b Second light shielding film
111c Third light shielding film
12 Resist film
12a Low-concentration region

The invention claimed is:
1. A mask blank with a resist film, comprising:
a substrate having a thin film; and
a negative resist film formed on a surface of the thin film, wherein in the resist film, a photoacid generator low-concentration region is formed at a part where the resist film is in contact with the thin film;

a concentration of the photoacid generator low-concentration region is lower than that of the other region of the resist film;

a thickness of the photoacid generator low-concentration region is 5% to 40% of the thickness of the resist film; and a concentration of the photo acid generator at a part in contact with the thin film in the photoacid generator low-concentration region is a value obtained by decreasing the concentration of the photo acid generator in the other region of the resist film by 10% to 40%.

2. The mask blank with the resist film according to claim 1, wherein in the photoacid generator low-concentration region, the concentration of the photoacid generator is gradually decreased in a direction from the resist film to the thin film.

3. The mask blank with the resist film according to claim 1, wherein the thin film is made of a material containing a transition metal selected from chromium, tantalum, ruthenium, tungsten, titanium, hafnium, molybdenum, nickel, vanadium, zirconium, niobium, palladium and rhodium, or a compound thereof.

4. The mask blank with the resist film according to claim 1, wherein the thin film is made of a material containing a compound of a transition metal and silicon.

5. The mask blank with the resist film according to claim 4, wherein the transition metal is at least one selected from molybdenum, tantalum, tungsten, titanium, hafnium, nickel, vanadium, zirconium, niobium, palladium, ruthenium, rhodium and chromium.

6. The mask blank with the resist film according to claim 1, wherein the thin film is made of a material containing a transition metal and at least one selected from oxygen, nitrogen and boron.

7. The mask blank with the resist film according to claim 6, wherein the transition metal is at least one selected from molybdenum, tantalum, tungsten, titanium, hafnium, nickel, vanadium, zirconium, niobium, palladium, ruthenium, rhodium and chromium.

* * * * *